United States Patent
Schumacher et al.

(10) Patent No.: US 9,081,925 B1
(45) Date of Patent: Jul. 14, 2015

(54) ESTIMATING SYSTEM PERFORMANCE USING AN INTEGRATED CIRCUIT

(75) Inventors: Paul R. Schumacher, Berthoud, CO (US); Graham F. Schelle, Boulder, CO (US); Patrick Lysaght, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 541 days.

(21) Appl. No.: 13/398,790

(22) Filed: Feb. 16, 2012

(51) Int. Cl.
*G06F 9/455* (2006.01)
*G06F 17/50* (2006.01)

(52) U.S. Cl.
CPC ........ *G06F 17/5022* (2013.01); *G06F 2201/86* (2013.01)

(58) Field of Classification Search
None
See application file for complete search history.

(56) References Cited

U.S. PATENT DOCUMENTS

| | | | | |
|---|---|---|---|---|
| 5,327,361 A * | 7/1994 | Long et al. | | 703/15 |
| 5,548,785 A * | 8/1996 | Fogg et al. | | 710/21 |
| 5,937,179 A * | 8/1999 | Swoboda | | 716/103 |
| 5,946,472 A * | 8/1999 | Graves et al. | | 703/6 |
| 7,290,228 B2 * | 10/2007 | Guenther et al. | | 716/106 |
| 7,444,276 B2 * | 10/2008 | Watt et al. | | 703/15 |
| 7,756,695 B2 * | 7/2010 | O'Niell et al. | | 703/14 |
| 7,769,577 B2 * | 8/2010 | Guenther et al. | | 703/13 |
| 7,865,346 B2 * | 1/2011 | Gunther et al. | | 703/13 |
| 7,877,249 B2 * | 1/2011 | Guenther et al. | | 703/22 |
| 2002/0059054 A1 * | 5/2002 | Bade et al. | | 703/20 |
| 2003/0105617 A1 * | 6/2003 | Cadambi et al. | | 703/14 |
| 2004/0078179 A1 * | 4/2004 | Fuji et al. | | 703/15 |
| 2004/0123258 A1 * | 6/2004 | Butts | | 716/5 |
| 2005/0256696 A1 * | 11/2005 | Gooding et al. | | 703/23 |
| 2006/0155525 A1 * | 7/2006 | Aguilar et al. | | 703/26 |
| 2006/0190232 A1 * | 8/2006 | Guenther et al. | | 703/15 |
| 2007/0044079 A1 * | 2/2007 | Ganesan et al. | | 717/136 |
| 2007/0067150 A1 * | 3/2007 | Musselman | | 703/14 |
| 2007/0074000 A1 * | 3/2007 | Colwill et al. | | 712/11 |
| 2007/0162270 A1 * | 7/2007 | Guenther et al. | | 703/22 |
| 2007/0219771 A1 * | 9/2007 | Verheyen et al. | | 703/15 |
| 2007/0294071 A1 * | 12/2007 | Guenther et al. | | 703/15 |
| 2008/0222633 A1 * | 9/2008 | Kami | | 718/1 |
| 2008/0243462 A1 * | 10/2008 | Guenther et al. | | 703/15 |
| 2008/0288230 A1 * | 11/2008 | Fernsler et al. | | 703/14 |
| 2008/0306721 A1 * | 12/2008 | Yang | | 703/14 |
| 2008/0306722 A1 * | 12/2008 | Fujii et al. | | 703/15 |
| 2010/0201695 A1 * | 8/2010 | Hill et al. | | 345/503 |
| 2011/0107162 A1 * | 5/2011 | Martinez Canedo | | 714/724 |
| 2011/0307233 A1 * | 12/2011 | Tseng et al. | | 703/14 |
| 2012/0144376 A1 * | 6/2012 | Van Eijndhoven | | 717/146 |
| 2012/0284446 A1 * | 11/2012 | Biran et al. | | 710/306 |

(Continued)

OTHER PUBLICATIONS

H. Kyung, G. Park, J. Kwak, W. Jeong, T. Kim, S. Park, "Performance Monitor Unit Design for an Axi-based Multi Core SoC platform" ACM 2007, pp. 1565-1572.*

(Continued)

*Primary Examiner* — Kibrom K Gebresilassie
(74) *Attorney, Agent, or Firm* — Kevin T. Cuenot

(57) ABSTRACT

A method of estimating performance of a design can include selecting a segment of the design for hardware emulation within an emulation system implemented within an integrated circuit. The emulation system can include a generic accelerator coupled to a processor of the integrated circuit. The method further can include modifying the design, using a processor of a host system, to invoke the generic accelerator in lieu of executing the selected segment within the processor of the emulation system during emulation.

18 Claims, 5 Drawing Sheets

(56) References Cited

U.S. PATENT DOCUMENTS

2013/0170525 A1* 7/2013 Asaad et al. ............... 375/219
2013/0212554 A1* 8/2013 Maeda et al. ............... 717/105

OTHER PUBLICATIONS

ARM, "ARM Profiler Non-Intrusive Performance Analysis", 3 pgs., printed Nov. 22, 2011 from website http://www.arm.com/products/tools/software-tools/rvds/arm-profiler.php.

Kyung, Hyun-Min, et al., "Performance Monitor Unit Design for an AXI-based Multi-Core SoC Platform", pp. Mar. 2007, 1565-1572, SAC '07: Proceedings of 2007 ACM symposium on Applied computing, ACM.

Park, Gi-Ho, et al., "Building Various Levels of SOC Architecture Exploration Environments: System Level Simulator, Emulator and FPGA Prototype Board", Jun. 9, 2009, 5 pp., Advanced Program for WARP2007, Samsung Electronics.

Xilinx, Inc., "AXI Bus Functional Model v1.9", Product Brief, PB 001, Jun. 22, 2011, pp. 1-3, Xilinx, Inc., 2100 Logic Drive, San Jose, CA 95124, http://www.xilinx.com/support/documentation_/ip_documentation/cdn_axi_bfm/v1_9/pb001_axi_bfm.pdf.

Xilinx, Inc., "AXI Bus Functional Model v2.1", Product Specification, DS824, Oct. 19, 2011, pp. 1-51, Xilinx, Inc., 2100 Logic Drive, San Jose, CA 95124, http://www.xilinx.com/support/documentation_/ip_documentation/cdn_axi_bfm/v2.1/ds824_axi_bfm.pdf.

U.S. Appl. No. 13/676,035, filed Nov. 13, 2012, Schumacher et al.

U.S. Appl. No. 14/278,263, filed May 15, 2014, Schumacher et al.

U.S. Appl. No. 14/280,211, filed Mar. 16, 2014, Schumacher et al.

Berkeley Design Technology, Inc., *An Independent Evaluation of: The AutoESL AutoPilot High-Level Synthesis Tool*, copyright 2010, pp. 1-14, Berkeley Design Technology, Inc., Walnut Creek, California, USA.

Pratt, Brian et al., "Improving FPGA Design Robustness with Partial TMR," *44th Annual IEEE International Physics Symposium Proceedings*, Mar. 26, 2006, pp. 226-232, IEEE, Piscataway, New Jersey, USA.

* cited by examiner

ESTIMATING SYSTEM PERFORMANCE USING AN INTEGRATED CIRCUIT

FIELD OF THE INVENTION

One or more embodiments disclosed within this specification relate to integrated circuits (ICs). More particularly, one or more embodiments relate to estimating system performance using an IC.

BACKGROUND

Estimating the likely performance of a system is an important part of the design process. A variety of performance estimation tools are available for system designers of application specific integrated circuits (ASICs). Similarly, a variety of different performance estimation tools are available for developing purely software-based systems. Whether hardware-based or software-based, the approach taken by most performance estimation tools is to add monitor functionality to existing designs. This approach necessarily infers that the complete design for which performance estimation is desired, whether hardware or software, is fully realized. The necessity of having a fully realized design makes many performance estimation tools unusable in the early stages of system design when many architectural decisions are made.

SUMMARY

One or more embodiments disclosed within this specification relate to integrated circuits (ICs) and, more particularly, to estimating system performance using an IC.

An embodiment can include a method of estimating performance of a design. The method can include selecting a segment of the design for hardware emulation within an emulation system implemented within an IC. The emulation system can include a generic accelerator coupled to a processor of the IC. The method further can include modifying the design, using a processor of a host system, to invoke the generic accelerator in lieu of executing the selected segment within the processor of the emulation system during emulation.

Another embodiment can include an IC. The IC can include a processor and a first generic accelerator. The first generic accelerator can include a first port through which the first generic accelerator is programmed and a second port coupled to the processor through which the first generic accelerator communicates with the processor during emulation. The IC also can include a monitor circuit configured to monitor communication between the first generic accelerator and the processor during emulation.

Another embodiment can include a system. The system can include an IC that includes a processor configured to execute a design having a plurality of segments of program code. A first segment of program code of the plurality of segments of program code can be selected for hardware emulation. A first generic accelerator can be implemented within the IC. The first generic accelerator can include a first port and a second port coupled to the processor. The first generic accelerator can be programmed via the first port to generate a first data traffic pattern to the processor over the second port during emulation.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to estimating system performance using an IC. An IC, e.g., a programmable IC, can be used to implement a configurable hardware platform that can be used to emulate a design for a system. In one aspect, the design to be emulated can be specified in the form of program code intended to execute on a processor. One or more segments of the program code can be selected for hardware acceleration. The one or more embodiments disclosed within this specification can be used in the early stages of system design to emulate various system architectures in which different segments of the design are selected for hardware acceleration. The resulting system architectures can be evaluated for performance to provide an estimate of the performance for each of the system architectures that is emulated. The performance estimates can be determined without having to design actual circuit implementations of the hardware accelerators.

Figure 1:
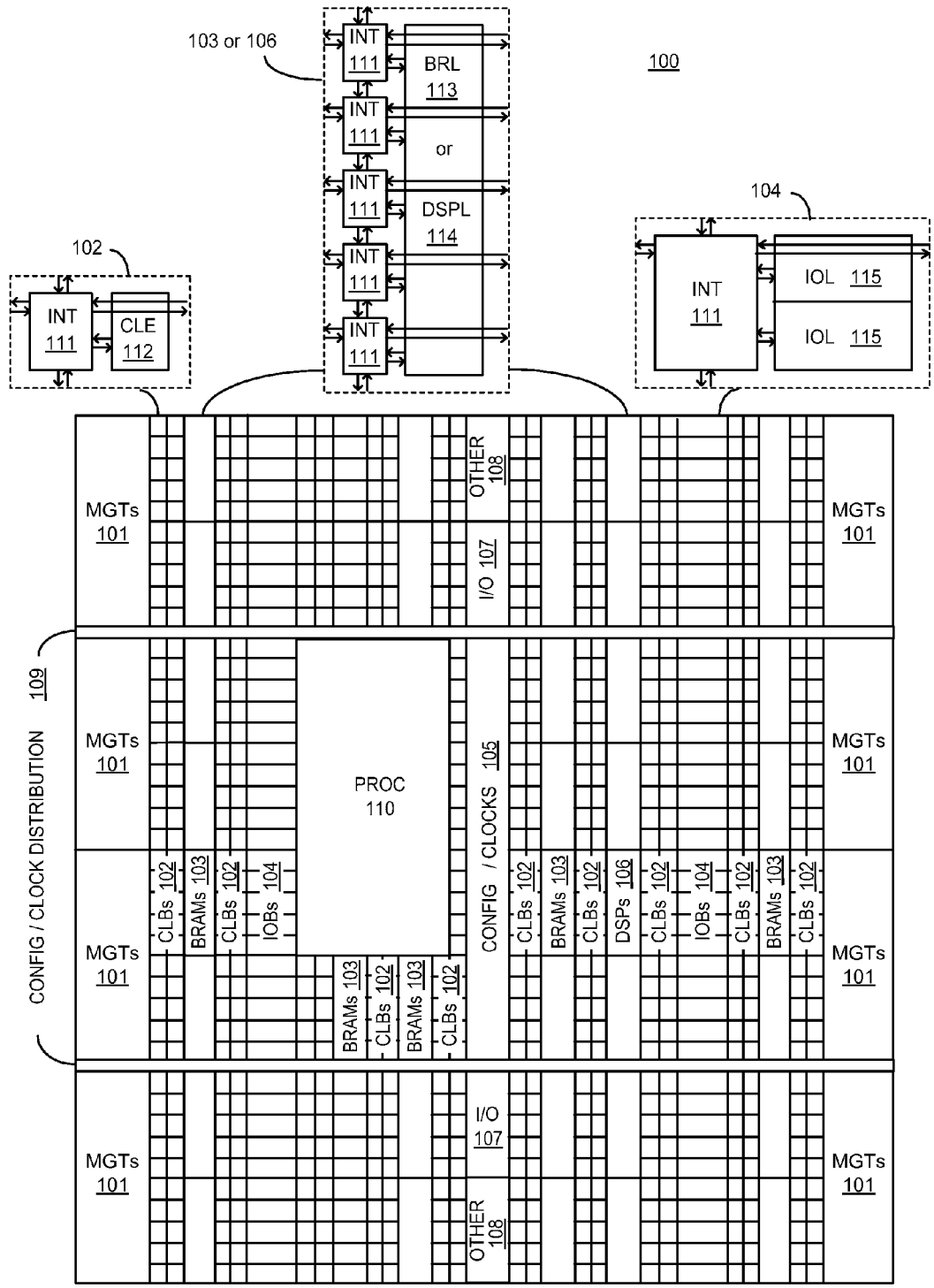
FIG. 1 is a block diagram illustrating an exemplary architecture for an integrated circuit in accordance with an embodiment disclosed within this specification.

FIG. 1 is a block diagram illustrating an exemplary architecture 100 for an IC in accordance with an embodiment disclosed within this specification. Architecture 100 can be implemented within a field programmable gate array (FPGA) type of IC, for example. As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, the INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of INTs 111. An 10B 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107, and 108, can be used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks can be programmable blocks and/or dedicated circuitry. For example, a processor block depicted as PROC 110 spans several columns of CLBs and BRAMs.

PROC 110 can be implemented as a hard-wired processor that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like. It should be appreciated, however, that the inclusion of a hard-wired processor such as PROC 110 can be excluded from architecture 100 and replaced with one or more of the other varieties of programmable blocks described. Further, such blocks can be utilized to form a "soft processor" in that the various blocks of programmable circuitry can be used to form a processor that can execute program code as is the case with hard-wired PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 103 and BRAMs 103 can be considered programmable circuitry of the IC.

In general, the functionality of programmable circuitry is not established until configuration data is loaded into the IC. A set of configuration bits can be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 110 within the IC are for purposes of illustration only and are not intended as a limitation of the one or more embodiments disclosed within this specification.

Figure 2:
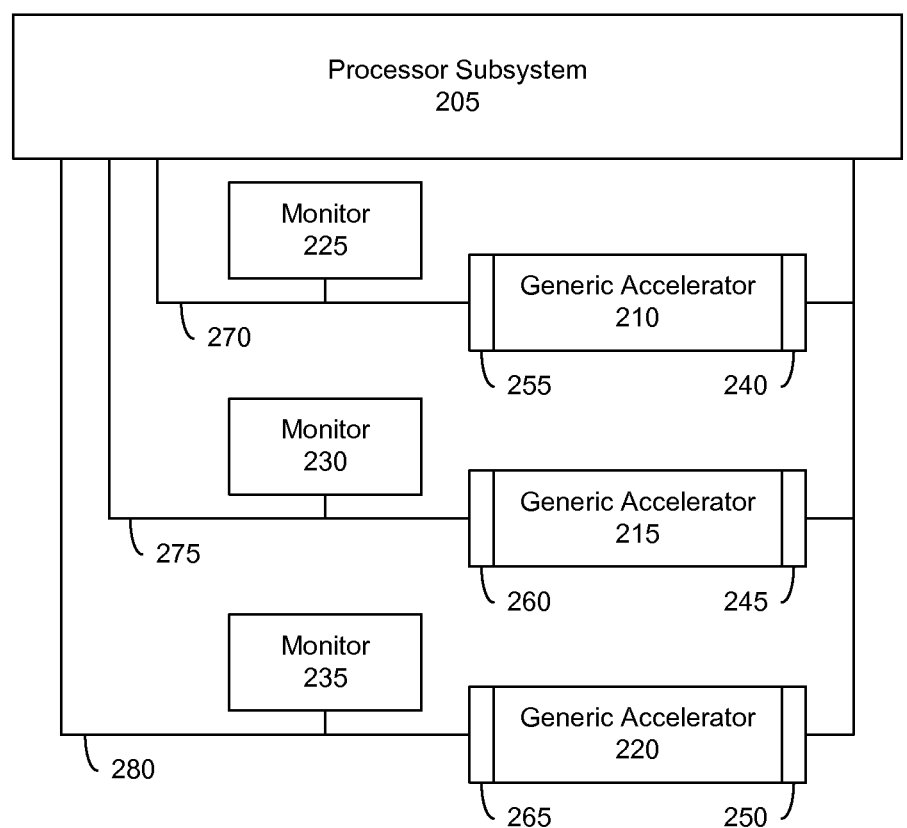
FIG. 2 is a block diagram illustrating an emulation system in accordance with another embodiment disclosed within this specification.

FIG. 2 is a block diagram illustrating an emulation system 200 in accordance with another embodiment disclosed within this specification. Emulation system 200 can be implemented within an IC that includes programmable circuitry. For example, emulation system 200 can be implemented within a programmable IC as described with reference to FIG. 1. In illustration, a configuration bitstream specifying the circuitry pictured in FIG. 2 can be generated and loaded into a programmable IC to implement emulation system 200 within the programmable IC. In this regard, emulation system 200 can be implemented using a single bitstream to emulate any of a variety of different system architectures to be implemented within, and emulated using, a programmable IC.

As pictured, emulation system 200 can include a processor subsystem (processor) 205, one or more generic accelerators 210, 215, and 220, and one or more monitors 225, 230, and 235. It should be appreciated that the particular number of generic accelerators 210-220 and corresponding monitors 225-235 is provided for purposes of illustration only and is not intended to limit the one or more embodiments disclosed within this specification. For example, fewer or more generic accelerators and corresponding monitors can be included without limitation.

In general, each of generic accelerators 210-220 and monitors 225-235 can be implemented using programmable circuitry of the IC. Processor 205 can be implemented as a hard-wired processor. It should be appreciated, however, that processor 205 also can be implemented in the form of a soft-processor as described with reference to FIG. 1.

In one aspect, each of generic accelerators 210-220 can be implemented as similar or identical circuits. Each of generic accelerators 210-220 can include a first communication port (port) 240, 245, and 250, respectively that is coupled to processor 205. Each of generic accelerators 210-220 can include a second port 255, 260, and 265 that is also coupled to processor 205. Accordingly, processor 205 can have two independent interfaces to each of accelerators 210-220.

For example, ports 240-250 can be reserved for receiving accelerator programming data. Once emulation system 200 is implemented within an IC, processor 205 can send accelerator programming data to each of generic accelerators 210-220 via ports 240-250, respectively. Through ports 240-250, for example, processor 205 can program, or define, the interconnect access patterns for each respective generic accelerator 210-220 prior to beginning emulation.

Accelerator programming data can specify one or more settings or values that specify behavioral characteristics of each generic accelerator 210-220. In one aspect, each generic accelerator 210-220 can be programmed to mimic the behavior of a particular segment of program code that is selected for hardware acceleration and which is to be emulated by a generic accelerator. Once programmed, a generic accelerator can emulate, or model, any of a variety of different data traffic patterns expected to be generated or consumed by a hardware implementation of the segment of program code modeled by the generic accelerator. The generic accelerator can write data, e.g., generate traffic, and consume or read data, e.g., receive traffic, that would otherwise be generated or consumed by the segment of program code modeled by the generic accelerator.

For example, the accelerator programming data can specify one or more commands for moving data between processor 205 and the generic accelerator. The various commands can include read commands, write commands, or a combination of read and write commands. Each respective read and/or write command can specify an amount of data that is to be read or written. Each read and/or write command also can specify a "delay" parameter that indicates the amount of time to wait before the generic accelerator is to implement the command after the prior command executes (e.g., after the prior transaction completes). In addition, each of the generic accelerators can be configured to implement a repeat, e.g., loop, mode. In the repeat mode, the same sequence of data traffic patterns, e.g., sequence of commands, can be repeated for a particular number of times as specified through programming of the generic accelerator.

Accordingly, each of generic accelerators 210-220 can be programmed with a sequence of commands, as specified by the accelerator programming data, that allows each of generic accelerators 210-220 to emulate various types of circuit blocks. In one aspect, for example, the sequences of commands can cause a generic accelerator to emulate a circuit block that is polled by processor 205. In another aspect, the sequences of commands can allow a generic accelerator to emulate a circuit block that is interrupt driven, or the like. The sequences of commands also allow a generic accelerator to mimic various types of data transfers, including, direct memory access (DMA) transfers, or the like. In addition, the sequences of commands can create dependencies among individual ones of generic accelerators 210-220 and between one or more or each respective one of generic accelerators 210-220 and processor 205.

One example of a command sequence can cause a generic accelerator to emulate the following behavior: read in N bytes of data, take M cycles to process the data, and move P bytes of data out of the generic accelerator to processor 205. In this example, each of N, M, and P can be integer values. The generic accelerator, once programmed with accelerator programming data specifying the aforementioned commands, can read in N bytes of data sent from processor 205, wait M cycles, and generate P bytes of data that is sent to processor 205.

Ports 255-265 can be reserved for use during emulation. For example, once emulation system 200 is implemented within an IC and each of generic accelerators 210-220 is programmed via ports 240-250 respectively, emulation can begin. Communications between processor 205 and each of generic accelerators 210-220 can be conducted via ports 255-265, respectively, during emulation. In one aspect, each of ports 255-265 can be implemented as a master/slave interface to communicate with processor 205 during emulation.

Port 255 can be coupled to processor 205 via communication link 270. Port 260 can be coupled to processor 205 via communication link 275. Port 265 can be coupled to processor 205 via communication link 280. In one aspect, each of communication links 270, 275, and 280 can be implemented as a bus or other suitable circuitry.

For example, processor 205 can include a plurality of AXI interfaces through which processor 205 can communicate with generic accelerators 255. Communication links 270, 275, and 280 can couple to the AXI interfaces and communicate using the AXI protocol. In general, an AXI interface can be used to connect one or more AXI memory-mapped master devices to one or more memory-mapped slave devices. In one aspect, the AXI interfaces can conform to the AMBA® AXI version 4 specification from ARM®, including the AXI4-Lite control register interface subset. It should be appreciated, however, that AXI interfaces are provided for purposes of illustration only. In one or more other embodiments, other varieties of interfaces and/or communication protocols suitable for communication between a hardware accelerator and a processor can be used in place of, or in combination with, one or more AXI interfaces.

Monitors 225-235 can be coupled to communication link 270, 275, and 280, respectively, to measure various parameters during emulation. Monitors 225-235 can be configured to detect or identify information on communication links 270-280 such as, for example, timestamps of start and end times of address information, data, and generic accelerator execution (e.g., execution of a sequence or particular number of commands). In one aspect, this data can be exported to another system, e.g., a processing system coupled to the IC, for analysis.

In another aspect, monitors 225-235 can be configured to perform one or more computations to aggregate or summarize data detected on communication links 270-280. For example, monitors 225-235 can be configured to calculate delay and/or latency across the various communication links 270-280 with respect to generic accelerator operation. In further illustration, monitors 225-235 can calculate the amount of data carried on one or more of communication links 270-280, delays between sending and/or receiving a request from processor 205 to a particular one of generic accelerators 210-220, delays between sending a request to one of generic accelerators 210-220 and receiving a response from the generic accelerator, or the like.

While a plurality of individual monitors 225-235 are illustrated, the one or more embodiments disclosed herein are not intended to be so limited. In another aspect, rather than including a plurality of individual monitors 225-235, a single, larger monitor can be implemented. In that case, the monitor can be configured to detect activity as described upon each of communication links 270, 275, and 280. Such an embodiment can facilitate aggregation of data across generic accelerators 210-220.

In an embodiment, monitor 225 can write data to a memory (not shown) within the IC in which emulation system 200 is implemented for downloading or analysis subsequent to emulation. In this regard, each of monitors 230-235 also can be configured to write data to such a memory. In another embodiment, data collected by monitors 225-235 can be provided to an output port of the IC in which emulation system 200 is implemented for transmission to another system, e.g., a host computer system configured for data analysis.

As noted, the particular number of generic accelerators and corresponding monitors can vary according to need. The particular configuration bitstream that is loaded into the IC to implement emulation system 200 will define the particular number of generic accelerators implemented. In cases where fewer than the number of generic accelerators available within emulation system 200 are needed, unused generic accelerators within emulation system 200 can be programmed with accelerator programming data that effectively shuts down or deactivates the unused generic accelerator(s).

In another embodiment, the accelerator programming data can be loaded into emulation system 200 via a communication port such as a Joint Test Action Group (JTAG) port of the IC. Ports 240-250 of generic accelerators 210-220 can be coupled to a circuit element other than processor 205. For example, ports 240-250 can be coupled to a circuit element coupled to the JTAG port through which each of generic accelerators 210-220 can be programmed. In still another example, an application executing on a host processing system coupled to the IC can be used to program each of generic accelerators 210-220 through a communication port of the IC to which each of ports 240-250 is coupled. In such embodiments, processor 205 is not needed for purposes of programming, e.g., providing accelerator programming data, to each of generic accelerators 210-220.

It should be appreciated that each of generic accelerators 210-220 can be programmed independently of the others. For example, one or more of generic accelerators 210-220 can be programmed using the same accelerator programming data, e.g., when the particular segment of the design emulated by each generic accelerator has the same or similar expected performance. In that case, generic accelerators programmed the same will generate the same data traffic patterns. In another example, one or more or all of generic accelerators 210-220 can be programmed differently, i.e., using different accelerator programming data. In that case, each of generic accelerators 210-220 programmed differently will generate different data traffic patterns.

Figure 3:
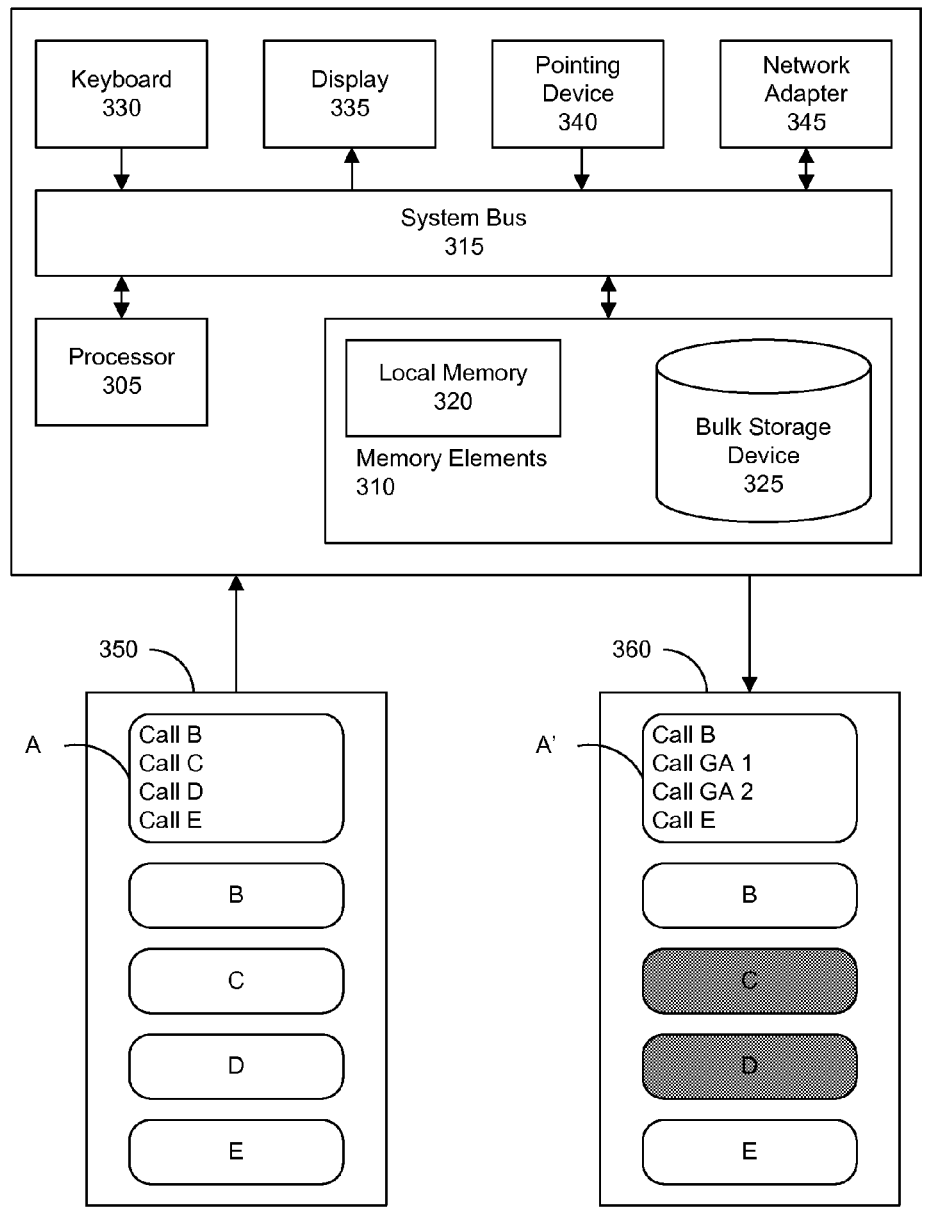
FIG. 3 is a block diagram illustrating a system for processing a design in accordance with another embodiment disclosed within this specification.

FIG. 3 is a block diagram illustrating a system 300 for processing a design in accordance with another embodiment disclosed within this specification. In general, system 300 can receive a design 350 as input and generate a modified version of design 350, i.e., design 360, as output.

System 300 can include at least one processor 305 coupled to memory elements 310 through a system bus 315. As such, system 300 can store program code within memory elements 310. Processor 305 can execute the program code accessed from memory elements 310 via system bus 315, or other suitable circuitry. In one aspect, for example, system 300 can be implemented as a computer that is suitable for storing and/or executing program code. It should be appreciated, however, that system 300 can be implemented in the form of any system including a processor and memory that is capable of performing the functions described within this specification.

Memory elements 310 can include one or more physical memory devices such as, for example, local memory 320 and one or more bulk storage devices 325. Local memory 320 refers to random access memory or other non-persistent memory device(s) generally used during actual execution of the program code. Bulk storage device(s) 325 can be implemented as a hard drive or other persistent data storage device. System 300 also can include one or more cache memories (not shown) that provide temporary storage of at least some program code in order to reduce the number of times program code must be retrieved from bulk storage device 325 during execution.

Input/output (I/O) devices such as a keyboard 330, a display 335, and a pointing device 340 optionally can be coupled to system 300. The I/O devices can be coupled to system 300 either directly or through intervening I/O controllers. Network adapters also can be coupled to system 300 to enable system 300 to become coupled to other systems, computer systems, remote printers, and/or remote storage devices through intervening private or public networks. Modems, cable modems, and Ethernet cards are examples of different types of network adapters that can be used with system 300.

Design 350 can be specified in the form of program code. For example, design 350 can include one or more segments of program code illustrated as segment A, e.g., a main routine or kernel, a segment B, a segment C, a segment D, and a segment E. For purposes of discussion and illustration, design 350 can be a programmatic description of a system that is to be implemented within an IC. In one aspect, design 350 can represent, or specify, a system that is to be implemented within a programmable IC that includes a processor executing program code that interacts with one or more hardware accelerators. The processor can be implemented as a processor or processor subsystem as described herein with reference to FIGS. 1 and/or 2. The hardware accelerators can be implemented as circuitry using the programmable circuitry of the IC.

Design 350 can be specified in a programming language such as a high level programming language that is executable by a processor or in a programming language that can be converted, e.g., compiled or translated, into a form that is executable or interpreted by a processor. Within this specification, the term program code, in reference to a programming language, is not intended to encompass hardware description languages such as VHDL and/or Verilog that are used to express hardware in the form of circuitry. Rather, program code is intended to refer to instructions that are executed by a processor either directly or after application of one or more processing (e.g., compilation) and/or translation steps.

For example, design 350 can be a computer program written in the "C" programming language. In general, design 350 can be executed by a processor within the IC. One or more of the various segments B, C, D, and/or E, of design 350, however, can be selected for implementation in the form of a hardware accelerator. When selected for hardware acceleration, the selected segment in the resulting design, as implemented within the IC, is implemented in the form of circuitry specifically configured to perform the same function(s) as the program code of the selected segment.

Rather than executing segment B in the processor, for example, the processor can offload the functionality otherwise implemented by segment B to circuitry called a hardware accelerator that is implemented within the programmable circuitry of the IC to perform the functions of segment B. The expectation is that the hardware accelerator can perform the same functionality as segment B, and do so in less time and/or with greater efficiently than had the processor executed segment B. The intent of utilizing hardware acceleration is to increase the performance of the overall system within the IC.

In the early stages of system design, selecting the particular segment, or segments, of program code to implement with hardware acceleration can be problematic. While design 350 may be available, or at least partially written in terms of executable program code, hardware implementations of the various segments B, C, D, and/or E are not designed. One cannot presume that efficiencies of a hardware implementation will be attainable simply through implementation of segment B, C, D, and/or E as a hardware accelerator. Such presumptions fail to account for effects including network congestion within the IC that can significantly reduce the ultimate performance of the design and other unexpected or unpredictable behaviors that may occur when a design includes a processor executing an operating system.

In many cases, the congestion and communication between the processor of the IC and the various hardware accelerators also implemented within the IC (e.g., the intra-IC networking) can reduce performance. While a hardware accelerator may perform a given function faster than the functionally equivalent program code can be executed in isolation, the time required to setup the hardware accelerator in terms of the processor of the IC providing the hardware accelerator with the necessary data, subsequently receiving the result from the hardware accelerator, and potential dependencies upon other hardware accelerators also serviced by the same processor may be so time consuming that much, if not all, of the benefit of the faster processing from the hardware accelerator is lost. As such, the particular segments of a design that are desirable candidates for hardware acceleration are not entirely clear. As such, the architecture of the design, as implemented within the IC is not easily determined.

Emulation using a system such as emulation system 200 of FIG. 2 can alleviate this problem. Emulation using emulation system 200 provides for increased opportunity for design exploration in terms of identifying segments of design 350 for hardware acceleration. Accordingly, design 350 can undergo a transformation to design 360 by system 300. System 300 can receive design 350 as input and generate design 360 as output. As used herein, "outputting" and/or "output," in reference to a computing system, can mean storing in memory elements 310, for example, writing to a file stored in memory elements 310, writing to display 335 or other peripheral output device, sending or transmitting to another system, exporting, or the like.

Within design 360, segment A has been transformed into segment A'. Within segment A', the call to segment C has been replaced with a call to "GA 1," which is a portion of program code that can be configured to call a first generic accelerator, e.g., generic accelerator "GA 1." Similarly, the call to segment D has been replaced with a call to "GA 2," which is a portion of program code that can be configured to call a second generic accelerator, e.g., generic accelerator "GA 2." As shown, segments C and D in design 360 are shown with shading to indicate that each segment is no longer called or invoked from segment A'. It should be appreciated that segments C and D may still be included in design 360, but not called or otherwise invoked (executed). In another example, segments C and D can be removed from design 360.

The system specified by design 360 can be emulated using emulation system 200. Taking FIGS. 2 and 3 in combination, whereas the entirety of design 350 executed on processor 205, only segments A, B, and E of design 360 execute on processor 205. The functions performed by segments C and D can be replaced through calls to hardware accelerators. Rather than developing the actual, detailed circuitry of the hardware accelerators to perform the functionality of segments C and D, respectively, behavioral aspects that may be expected from actual hardware accelerator implementations performing the functions of segments C and D can be determined.

The generic accelerators, e.g., generic accelerators 210 and 215, can be programmed with accelerator programming data specifying behavioral characteristics, e.g., the sequence of instructions, that cause each generic accelerator to behave as may be expected from an actual implementation of the selected segments in the form of hardware accelerators. Accordingly, design 360, in part, can be executed by processor 205. Rather than invoking and executing segments C and/or D within processor 205, segment A invokes generic accelerators GA 1 and GA 2.

Further, rather than perform the exact functions of segments C and D, GA 1 and GA 2 can generate data traffic patterns of hardware implementing the functionality of segment C and segment D and also consume data that would otherwise be provided to segment C and segment D respectively. For example, GA 1 and GA 2 can receive data, incur processing delays, exhibit dependencies upon other generic accelerators, and output data in accordance with the expected behavior of an actual hardware accelerator implementing the functionality of segment C and segment D. Recall, however, that GA 1 and GA 2 can be physically similar or identical circuits, but be programmed with different accelerator programming data to generate different data traffic patterns, e.g., where GA 1 emulates data traffic patterns of segment C and GA 2 emulates the data traffic patterns of segment D.

It should be appreciated that since each generic accelerator effectively emulates the data traffic patterns of a segment of program code, the actual data that is exchanged between a generic accelerator and the processor during emulation need not be actual or live data. The actual content of the data may not be the same as the content generated in an actual system. The number, size, and timing of the transactions, however, can closely track actual hardware accelerator implementations thereby allowing a designer to determine likely performance of the actual system architecture being emulated.

Figure 4:
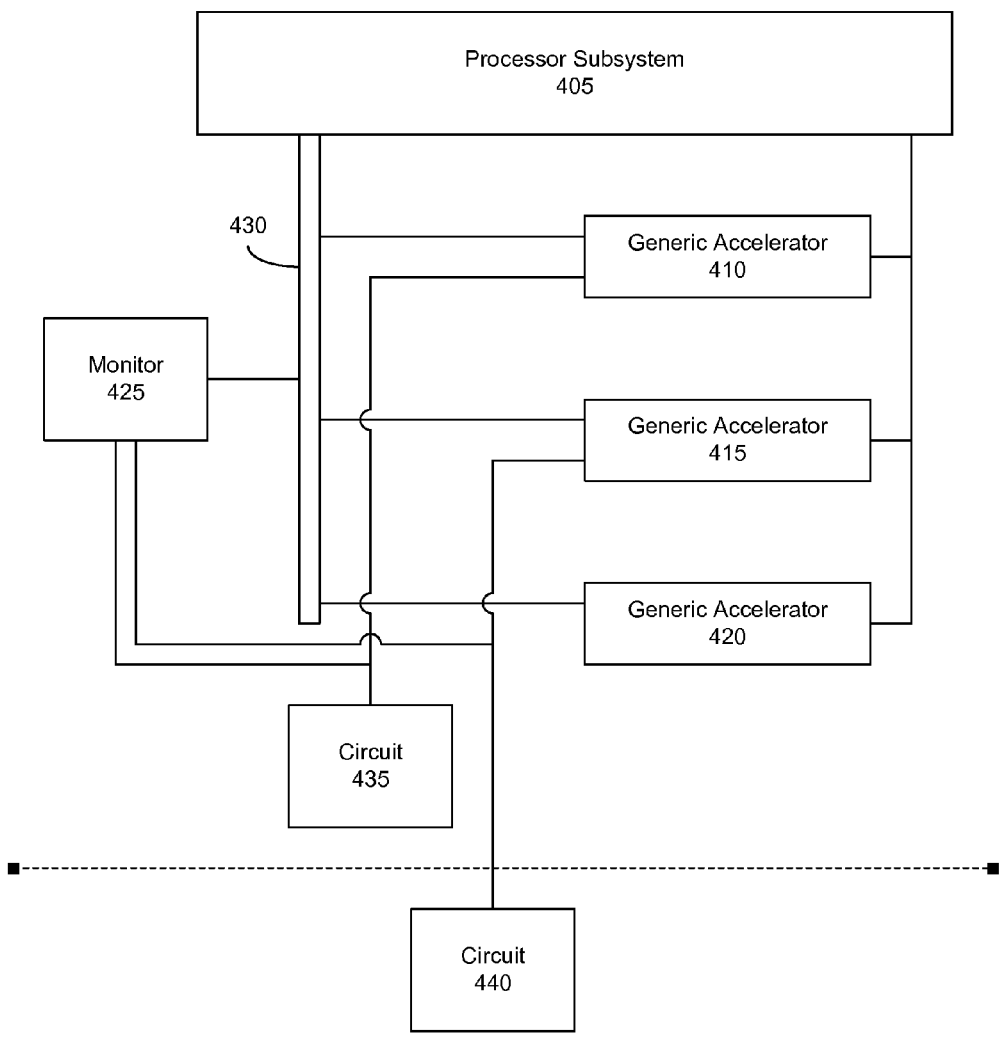
FIG. 4 is a block diagram illustrating an emulation system in accordance with another embodiment disclosed within this specification.

FIG. 4 is a block diagram illustrating an emulation system 400 in accordance with another embodiment disclosed within this specification. Emulation system 400 can be implemented within an IC having programmable circuitry as described within this specification. Emulation system 400 can include a processor subsystem (processor) 405, one or more generic accelerators 410, 415, and 420, and a monitor 425. Emulation system can be implemented substantially similar to emulation system 200 of FIG. 2. FIG. 4, however, illustrates an example in which a single monitor 425 is utilized. Particular details such as the ports of the generic accelerators 410-420 are not shown.

Emulation system 400 illustrates that each of generic accelerators 410-420 can communicate with processor 405 and with one another via a bus 430. As shown, each of generic accelerators 410-420 is coupled to bus 430. Likewise, processor 405 is coupled to bus 430. As such, each generic accelerator can communicate with each other generic accelerator via bus 430 and with processor 405. Monitor 425 can be configured to monitor the various transactions, as previously described, that occur over bus 430. In one aspect, when implemented as shown in FIG. 4, the various commands that can be used to program generic accelerators 410-420 also can specify destination information so that data can be directed to one or more other particular accelerators in addition to, or in lieu of, processor 405.

In addition, FIG. 4 illustrates that one or more generic accelerators can be coupled to circuit blocks other than processor 405 and other generic accelerators. In the example shown in FIG. 4, generic accelerator 410 is coupled to circuit 435. Circuit 435 can be a circuit implemented within the IC in which emulation system 400 is implemented. For example, circuit 435 can represent a random access memory (RAM) or other subsystem. As shown, monitor 425 can be coupled to the communication link between generic accelerator 410 and circuit 435. Accordingly, monitor 425 can detect transactions that take place between generic accelerator 410 and circuit 435.

In another aspect, one or more generic accelerators can be coupled to circuits that are external to the IC in which emulation system 400 is implemented. The dashed line between circuit 435 and circuit 440 illustrates a physical boundary of the IC in which emulation system 400 is implemented. In the example pictured in FIG. 4, generic accelerator 415 is coupled to circuit 440. Circuit 440 can represent any of a variety of other systems and/or circuits that can reside external to the IC in which emulation system 400 is implemented. For example, circuit 440 can represent a controller, another processor, a RAM, or the like. It should be appreciated that communication with a system such as circuit 440 that resides external to emulation system 400 can be performed through one or more of the I/O blocks or interfaces described with reference to FIG. 1. As shown, monitor 425 can be coupled to the communication link between generic accelerator 415 and circuit 440 within the IC so as to detect transactions that occur via the communication link.

The architecture shown in FIG. 4 is presented for purposes of illustration only and is not intended to limit the one or more embodiments disclosed within this specification. Other variations of emulation system 400 can be implemented. For example, rather than using bus 430 to facilitate communication between generic accelerators 410-420, one or more of the generic accelerators 410-420 can be communicatively linked via a bus that is separate and independent of the bus through which each of generic accelerators 410-420 communicates with processor 405. One or more monitors can be configured to detect transactions occurring over each such bus.

In another example, one or more or all of generic accelerators 410-420 can be coupled together via a series of individual communication links that couple selected ones, e.g., selected pairs or combinations of pairs, of the generic accelerators. For instance, direct connections such as AXI, switched point-to-point type of connections can be used to couple selected ones of generic accelerators 410-420 together for direct communication with one another. Generic accelerator 410 can be directly coupled to generic accelerator 415 and/or directly coupled to generic accelerator 420, for example. Similarly, generic accelerator 420 can be directly coupled to generic accelerator 415. In such an embodiment, generic accelerators 410-420 can be communicatively linked with processor 405 as shown in FIG. 4 or communicatively linked with processor 405 as illustrated in FIG. 2 using separate communication links. Regardless of the particular configuration, one or more monitors, as described, can be coupled to the links that directly couple generic accelerators and the links that couple the generic accelerators with the processor in order to detect transactions taking place over the respective communication links.

Figure 5:
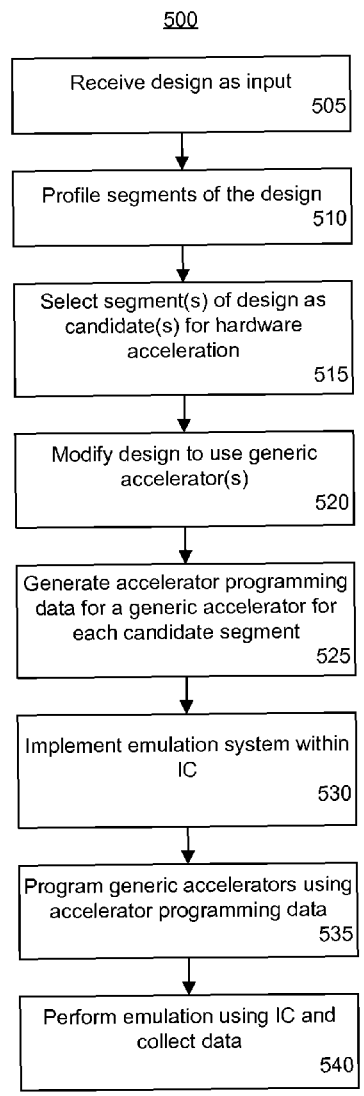
FIG. 5 is a flow chart illustrating a method of estimating performance of a system in accordance with another embodiment disclosed within this specification.

FIG. 5 is a flow chart illustrating a method 500 of estimating performance of a system in accordance with another embodiment disclosed within this specification. Method 500 can be performed, at least in part, by a system as described with reference to FIG. 3 of this specification. The system can include suitable program code that, when executed, causes the system to perform the various functions described with reference to FIG. 5.

Accordingly, method 500 can begin in block 505 where the system receives a design for processing. For example, a designer can load or otherwise specify program code including one or more segments to the system. In block 510, the system can profile segments of the design. In profiling the various segments of the design, the system can determine one or more execution attributes of the design including, but not limited to, the number of processing cycles needed for one or more or each of the segments to execute, the latency in executing, the amount of data that is consumed by the segment as input when executed, the amount of data that is generated and output by the segment responsive to execution, the read address intervals, the write address intervals, and the like.

In general, a write address interval and a read address interval each refer to a data interval, for a write operation or a read operation respectively. A data interval specifies the total amount of time of a burst of data to occur. The total amount of time is measured from the beginning of the burst of data to the end of the burst of data. In illustration, a burst of data typically includes multiple "beats" of a data transfer. A "beat" can refer to one word or portion of data that is transferred per clock cycle for a particular number, e.g., 256, of clock cycles. The first beat represents or signifies the beginning of the data interval (e.g., the data transfer) and the last beat signifies the end of the data interval.

The system can evaluate data transfers of the design, e.g., the high-level program code, and determine a likely translation in terms of data intervals for the generic accelerators. Such data intervals do not account for congestion within the emulation system. Rather, the data intervals serve as estimates of how data exchanged in the high-level program code of the design will translate into transactions in the emulation system, e.g., between the processor and a generic accelerator.

In block 515, the system can select one or more segments of the design as candidate(s) for hardware acceleration, or hardware emulation as the case may be. In one aspect, one or more execution attributes determined in block 510 can be compared with established criteria for selecting a segment as a candidate. For example, a threshold can be determined for one or more attributes such as a number of processing cycles, latency, an amount of data provided as input, an amount of data generated as output, etc. The execution parameters can be compared with the respective thresholds. Those segments having one or more execution attributes that exceed a threshold, or some number or specific combination of thresholds, can be selected as a candidate for hardware acceleration.

In another aspect, the particular segments of the design that are selected as candidates for hardware emulation can be specified via a user specified input. For example, the user, working through a user interface provided by the system, can designate particular segments of the design that are to be hardware accelerated. Responsive to the user input, the system can select each segment specified by the user input as a candidate for hardware acceleration.

It should be appreciated that while various techniques are disclosed for selecting a segment of program code for hardware emulation, in another aspect, the one or more embodiments disclosed herein can be used to emulation intellectual property (IP) blocks or cores. For example, a user may wish to incorporate an IP block such as a core or the like from a third party vendor. In that case, the IP block, like a segment of program code of the design, can be represented in the design using a segment. The segment can include a reference or other indicator that the segment is a proxy for the IP block. For example, in one aspect, the segment need not include program code that is executable, but rather include information that can be interpreted or compiled by the system to indicate that the segment is to be hardware emulated using a generic accelerator. The indicator can be any of a variety of codes and/or symbols, for example, codes, characters, or symbols that can be located in a comment line or the like. Upon detecting the indicator, the segment, whether including actual program code or serving as a placeholder for an IP core, can be designated as a candidate for hardware acceleration and/or emulation.

In cases where the segment includes no programming code or insufficient programming code for the type of analysis described herein to determine execution attributes, the accelerator programming data needed for the generic accelerator can be specified or determined through other techniques. For example, the user can provide the accelerator programming data since the accelerator programming data cannot be derived from the segment itself. The user, for instance, can include a reference to the accelerator programming data within the segment, include the accelerator programming data within the segment itself along with indicators that the segment includes such data, for example, in lieu of program code, or otherwise specify the accelerator programming data to the system processing the design.

In block 520, the system can modify the design to utilize one or more generic accelerators. For example, the system can replace the candidate segments, e.g., the selected segments, with hardware models. The design can be modified so that a generic accelerator is invoked or called instead of each of the candidate segments. In illustration, each call that invokes the candidate segment can be replaced by the system with a call to a generic accelerator. It should be appreciated that each segment of the design selected as a candidate is replaced with a corresponding hardware model. Accordingly, one generic accelerator is called for each of the segments selected as a candidate for hardware acceleration, thereby maintaining a one-to-one relationship between generic accelerators of the emulation system and candidate segments of the design.

In block 525, the system can determine accelerator programming data corresponding to each candidate segment. As noted, for each candidate segment, the accelerator programming data corresponding to the candidate segment can be provided to the generic accelerator called in place of the candidate segment. As noted, the accelerator programming data can define the behavioral characteristics for each of the generic accelerators that are to be called in place of the candidate segments of the design.

In one aspect, the various execution attributes determined for a candidate segment can be correlated with available settings of a generic accelerator that is to replace the candidate segment for purposes of emulation. Appropriate values for the settings of the generic accelerator, e.g., behavioral characteristics, can be generated from the execution attributes of the corresponding candidate segment. For example, the execution attributes can be translated into accelerator programming data, e.g., commands. This process, as represented by block 525, can be repeated for each of the candidate segments and corresponding generic accelerators.

In another aspect, the execution attributes of a candidate segment can be compared with one or more profiles of various circuit types. Each profile can be specified in the form of accelerator programming data. The execution attributes can be correlated with the profiles to determine a match or best match. For example, various types of known and actual circuits such as matrix multipliers of a specified size, DSPs, Fast Fourier Transform (FFT) generators, filters, and the like can be profiled to develop accelerator programming data for various sizes, configurations, and the like to mimic the behavior of various permutations of the known circuits. The execution attributes of the candidate segment can be compared with the profiles. The accelerator programming data for the profile that matches, or most closely matches the attributes of the candidate segment can be selected for loading into the generic accelerator.

In still another aspect, a system designer can manually determine or otherwise specify the particular behavioral characteristics that are desired for a generic accelerator that is replacing the candidate segment. The system designer can utilize a software based tool executing within the system to specify the accelerator programming data. Alternatively, a system designer can select from among a plurality of profiles as described above, e.g., to program a generic accelerator to emulate a matrix multiplier, a DSP unit, an FFT generator, a particular filter type, or the like.

In block 530, an emulation system can be implemented within an IC, e.g., a programmable IC. For example, the system, e.g., a host processing system, can send a configuration bitstream specifying the emulation system as described with reference to FIG. 2 to the IC. The IC can load the configuration bitstream, thereby implementing the emulation system therein. It should be appreciated that as part of the IC configuration process, the modified version of the design, e.g., the version that invokes generic accelerators in lieu of executing the selected segments, can be loaded into the processor of the IC. Thus, the modified design, e.g., the user specified system design that includes calls to the generic accelerators in lieu of calling candidate segments, is loaded into the processor of the IC as part of loading the configuration bitstream.

In block 535, the system can program the generic accelerators of the emulation system within the IC. Each generic accelerator involved in the emulation can be programmed with the particular behavioral characteristics for the generic accelerator as determined in step 525. As discussed, in one example, the accelerator programming data for each generic accelerator that is to be used in the emulation can be provided to the IC from the system. Once provided to the IC, the processor can program each respective generic accelerator. In another aspect, the accelerator programming data can be provided via JTAG or other suitable communication port and loaded into each generic accelerator without utilizing the processor of the IC.

In block 540, the emulation system can initiate emulation (e.g., within the IC). For example, the host processing system can instruct the emulation system to begin emulation. Accordingly, the emulation system can begin to operate and collect data. The processor of the emulation system, for example, can begin executing the executable portions of the design and invoking the various ones of the generic accelerators programmed to emulate actual hardware versions of the candidate segments and generate data traffic patterns.

The data that is collected by the monitor(s) of the emulation system can reflect the performance of the particular design architecture being emulated within the emulation system. The data that is collected, as noted, can indicate the interactivity among the generic accelerators and interactivity between the generic accelerators and the processor of the IC. It should be appreciated that since the architecture of the IC is known, e.g., the interfaces and/or buses between the generic accelerator(s)

and the processor are known and well defined. As such, the resulting performance, as measured through the monitor(s), can provide an accurate portrayal of an actual implementation of the design including hardware accelerated versions of the candidate segments despite the generic accelerators not implementing the actual functionality of the candidate segments. In any case, the data collected by the monitor(s) can be read from the IC by the host processing system in real, in near-real time, or subsequent to the conclusion of the emulation process.

Because the emulation system utilizes generic accelerators, multiple iterations testing different architectures for the design can be emulated using the single configuration bitstream. For example, if additional or fewer generic accelerators are required, the generic accelerators can be programmed using one of the techniques described within this specification without reloading a different configuration bitstream into the IC. Generic accelerators can be programmed to emulate different circuits, e.g., generate different data traffic patterns, deactivated, or activated to generate a particular data traffic pattern, without loading a different configuration bitstream into the IC. In one aspect, further updates to program code executed in the processor, e.g., the design, can be loaded into the IC via a communication port, thereby avoiding the need to load a different configuration bitstream into the IC only to alter or modify the program code executed by the processor of the emulation system implemented therein.

Figure 6:
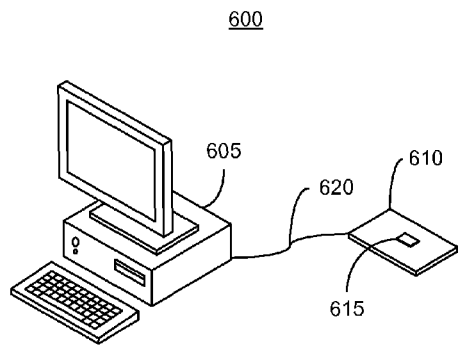
FIG. 6 is a block diagram illustrating a performance estimation system in accordance with another embodiment disclosed within this specification.

FIG. 6 is a block diagram illustrating a performance estimation system 600 in accordance with another embodiment disclosed within this specification. As shown, a host processing system, e.g., a computer, 605 is coupled to a test platform 610. In one aspect, test platform 610 can be implemented as a printed circuit board or other physical structure capable of hosting or receiving an IC 615, e.g., a programmable IC. Host processing system 605 can communicate with IC 615 via a communication link 620, e.g., a channel, coupled to test platform 610 and IC 615 via test platform 610.

Through communication link 620, host processing system 605 can send configuration bitstreams, programming data for generic accelerators, and input test data or test vectors for use during emulation to IC 615. Host processing system 605 can receive the test data collected by the monitors described with reference to FIG. 2 also via communication link 620. In one aspect, for example, communication link 620 can be coupled to a JTAG port of IC 615 through which data can be input or output.

In an embodiment, host processing system 605 can be configured to continually test different architectures, e.g., different design permutations testing different candidate segment combinations, until at least one architecture is identified that meets desired performance criteria or a stopping condition is reached such as executing for a minimum amount of time without finding a solution or trying a minimum number of architectures without finding a solution.

The one or more embodiments disclosed within this specification allow a system designer to compare performance characteristics of architectures for a design that use one or more and various combinations and/or permutations of hardware acceleration. The emulation system allows system designers to compare the efficiency of data movement among the architectures emulated without having to develop the circuitry of actual hardware accelerators.

For purposes of explanation, specific nomenclature is set forth to provide a thorough understanding of the various inventive concepts disclosed herein. The terminology used herein, however, is for the purpose of describing particular embodiments only and is not intended to be limiting. For example, reference throughout this specification to "one embodiment," "an embodiment," or similar language means that a particular feature, structure, or characteristic described in connection with the embodiment is included in at least one embodiment disclosed within this specification. Thus, appearances of the phrases "in one embodiment," "in an embodiment," and similar language throughout this specification may, but do not necessarily, all refer to the same embodiment.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which includes all the features enabling the implementation of the methods described herein. The device can include a data storage medium, e.g., a non-transitory computer-usable or computer-readable medium, storing program code that, when loaded and executed in a system including a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

Accordingly, the flowchart and block diagrams in the Figures illustrate the architecture, functionality, and operation of possible implementations of systems, methods and computer program products according to various embodiments of the one or more embodiments disclosed herein. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The corresponding structures, materials, acts, and equivalents of all means or step plus function elements in the claims below are intended to include any structure, material, or act for performing the function in combination with other claimed elements as specifically claimed.

The one or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of estimating performance of a design, the method comprising:
   selecting a segment of the design comprising a plurality of segments for hardware emulation;
   wherein the design is specified using processor-executable instructions; and
   modifying the design, using a processor of a host system, to invoke a generic accelerator of an emulation system in lieu of executing the selected segment within a processor of the emulation system;
   wherein at least one other segment of the plurality of segments executes in the processor of the emulation system;
   implementing the emulation system within an integrated circuit; and
   programming the generic accelerator to mimic behavior of the selected segment and generate a data traffic pattern corresponding to the selected segment without performing an exact function of the selected segment.

2. The method of claim 1, further comprising:
   programming the generic accelerator to receive data directed to the selected segment.

3. The method of claim 1, further comprising:
   programming the generic accelerator to generate a different data traffic pattern without re-implementing the emulation system within the integrated circuit.

4. The method of claim 1, further comprising:
   determining a plurality of execution attributes of the selected segment; and
   generating accelerator programming data specifying a data traffic pattern from the plurality of execution attributes; and
   programming the generic accelerator with the accelerator programming data to mimic behavior of the selected segment and generate the data traffic pattern without performing a function of the selected segment.

5. The method of claim 4, wherein the processor of the emulation system programs the generic accelerator with the accelerator programming data.

6. The method of claim 1, wherein modifying the design comprises replacing a call to the selected segment within the design with a call to executable program code invoking the generic accelerator.

7. The method of claim 1, further comprising:
   determining an execution attribute for each of a plurality of segments of the design; and
   for each segment, comparing the execution attribute with a selection criteria;
   wherein the selecting is performed according to the comparing.

8. The method of claim 1, further comprising:
   during emulation of the design using the emulation system, detecting data exchanged between the processor of the emulation system and the generic accelerator.

9. An integrated circuit, comprising:
   a processor;
   a first generic accelerator;
   wherein the first generic accelerator comprises:
      a first port through which the first generic accelerator is programmed;
      a second port coupled to the processor through which the first generic accelerator communicates with the processor during emulation; and
      a monitor circuit configured to monitor communication between the first generic accelerator and the processor during emulation;
   wherein the first generic accelerator mimics behavior of a segment of a design selected for hardware emulation from a plurality of segments of the design and the design is specified using processor-executable instructions; and
   wherein the first generic accelerator is programmed to generate a first data traffic pattern derived from the selected segment of the design selected for hardware emulation without performing an exact function of the selected segment.

10. The integrated circuit of claim 9, wherein at least one other segment of the plurality of segments not selected for hardware emulation executes in the processor of the emulation system.

11. The integrated circuit of claim 9, further comprising a second generic accelerator comprising circuitry identical to the first generic accelerator;

wherein the second generic accelerator is programmed to generate a second data traffic pattern to the processor.

12. A system, comprising:
an integrated circuit, comprising:
a processor configured to execute a design comprising a plurality of segments of program code comprising processor-executable instructions;
wherein a first segment of program code of the plurality of segments of program code is selected for hardware emulation; and
a first generic accelerator implemented within the integrated circuit;
wherein the first generic accelerator comprises a first port;
wherein the first generic accelerator comprises a second port coupled to the processor; and
wherein the first generic accelerator is programmed via the first port to generate a first data traffic pattern to the processor over the second port during emulation and mimicking behavior of the first segment of program code without performing an exact function of the first segment of program code.

13. The system of claim 12, wherein the first data traffic pattern is derived from the first segment of program code.

14. The system of claim 12, further comprising:
a monitor circuit coupled to a communication link between the second port and the processor;
wherein the monitor circuit is configured to detect communication between the first generic accelerator and the processor during emulation.

15. The system of claim 12, wherein the first generic accelerator is implemented responsive to loading a configuration bitstream into the integrated circuit;
wherein the first generic accelerator is programmable to generate a different data traffic pattern without loading a further configuration bitstream into the integrated circuit.

16. The system of claim 12, further comprising a second generic accelerator comprising circuitry identical to the first generic accelerator;
wherein the second generic accelerator is programmed to generate a second data traffic pattern to the processor.

17. The system of claim 12, further comprising:
a host processing system communicatively linked with the integrated circuit;
wherein the host processing system is configured to:
determine a plurality of execution attributes of the first segment of program code;
generate accelerator programming data from the plurality of execution attributes; and
provide the accelerator programming data to the integrated circuit.

18. The system of claim 17, wherein the host processing system selects the segment from the plurality of segments by comparing at least one execution attribute of the selected segment with established criteria for selecting segments for hardware emulation.

* * * * *